United States Patent [19]
Shimizu et al.

[11] Patent Number: 5,592,496
[45] Date of Patent: Jan. 7, 1997

[54] SEMICONDUCTOR TEST EQUIPMENT

[75] Inventors: Masao Shimizu; Kenji Yoshida, both of Gyoda, Japan

[73] Assignee: Advantest Corporation, Tokyo, Japan

[21] Appl. No.: 416,048

[22] Filed: Apr. 4, 1995

[30] Foreign Application Priority Data

Apr. 4, 1994 [JP] Japan ...................................... 6-087406

[51] Int. Cl.$^6$ ............................. G01R 31/28; G06F 11/00
[52] U.S. Cl. ........................... 371/27; 371/22.1; 371/25.1; 371/24; 324/158.1
[58] Field of Search ........................... 371/27, 25.1, 22.3, 371/25, 24, 21.1, 61, 22.1; 324/158 R, 73 R

[56] References Cited

U.S. PATENT DOCUMENTS

| | | | |
|---|---|---|---|
| 4,497,056 | 1/1985 | Sugamori | 371/25 |
| 5,018,145 | 5/1991 | Kikuchi et al. | 371/27 |
| 5,127,011 | 6/1992 | Combs et al. | 371/27 |
| 5,142,223 | 8/1992 | Higashino et al. | 324/158 R |
| 5,153,883 | 10/1992 | Hayashi et al. | 371/27 |
| 5,390,192 | 2/1995 | Fujieda | 371/27 |
| 5,432,797 | 7/1995 | Takano | 371/27 |

Primary Examiner—Robert W. Beausoliel, Jr.
Assistant Examiner—Nadeem Iqbal
Attorney, Agent, or Firm—Knobbe, Martens, Olson & Bear

[57] ABSTRACT

A semiconductor test equipment for testing a semiconductor device which is capable of reducing the cost and size is disclosed. The semiconductor test equipment includes a main clock generator for generating a main clock signal having the highest frequency, a first pattern generator which receives the main clock signal for generating a first test pattern signal, a clock divider which divides the main clock signal to generate a lower frequency clock signal, and a second pattern generator which receives the lower frequency clock for generating a second test pattern. The semiconductor test equipment further includes a first wave formatter which receives the first pattern signal for forming a predetermined wave shape, and a second wave formatter which receives the second pattern signal for forming a predetermined wave shape, a first comparator circuit which receives a first output signal from the device under test and compares the first output signal with a first expected pattern from the first pattern generator, and a second comparator circuit which receives a second output signal from the device under test and compares the second output signal with a second expected pattern from the second pattern generator.

4 Claims, 2 Drawing Sheets

5,592,496

SEMICONDUCTOR TEST EQUIPMENT

FIELD OF THE INVENTION

The present invention relates to a circuit structure which forms a semiconductor test equipment, and more particularly, to a circuit structure which can decrease the size and cost of the semiconductor test equipment.

BACKGROUND OF THE INVENTION

A conventional semiconductor test equipment is comprised of a circuit configuration as shown in FIG. 2. The conventional semiconductor test equipment 1 has a clock generator 2, a pattern generator 20, a wave formatter 3, a driver 5, a logic comparator 4 and an analog comparator 6. As shown in FIG. 2, a set of these circuit components are provided for each device pin 19 of a semiconductor device 7 to be tested. Thus, in an actual semiconductor test equipment 1, a large number of sets of circuit components are provided to meet the needs of testing the semiconductor device 7 having a large number of device pins.

The pattern generator 20 generates a test pattern signal and a reference pattern signal in response to the reference clock from the clock generator 2. The test pattern signal is provided to the wave formatter 3 wherein it is formatted to a predetermined waveform such as a non-return zero (NRZ) signal, a return-zero (RZ) signal or an exclusive OR (EOR) signal as is well known in the art. The test pattern signal from the wave formatter 3 is applied to the corresponding device pin 19b of the device under test 7 through the driver 5 which determines an amplitude and a slew rate of the test pattern signal.

The analog comparator 6 receives the output signal from the device pin 19b which is resulted in response to the test pattern signal and compares the output signal with a reference voltage (not shown) to determine whether the output signal from the pin 19b is logical "1" or "0 ". The logic comparator 4 compares the output of the analog comparator 6 with the reference pattern from the pattern generator 20 to determine whether the logic of the pin 19b agrees with the reference logic signal. If the output of the device pin 19a does not agree with the reference signal, the logic comparator 4 generates a fail signal.

The other pin 19c of the device under test 7 receives the test pattern signal through another set of the pattern generator 20, wave formatter 3 and the driver 5 and returns the resulted signal to another set of the analog comparator 6 and the logic comparator 4. In a similar manner, each of the other sets of circuit components in the semiconductor test equipment 1 is arranged to accommodate each of the other pins 19c–19n of the device under test 7.

Parameters of each test signal to be applied to each device pin of 19a, 19b, . . . 19n of the DUT 7 includes a time period, a voltage, a current. The parameters for each pin 19 of the DUT 7 are usually different from one another and have to be adjusted depending on the characteristics of the device 7 and the purpose of the test.

In the conventional semiconductor test equipment, all of these circuit components are designed to provide the highest possible performance to test a wide range of semiconductor devices. For example, the pattern generators 20 and the wave formatters 3 have the highest performance, i.e., an ability to generate and wave-shape the test pattern the frequency of which is high enough to fully evaluate devices in the market having a highest operating frequency. The drivers 5, for example, have been designed to drive the test pattern with the widest voltage or current swings required for testing devices which is to operate in the largest amplitude. The analog comparators 6 and the logic comparators 4 have also been designed to meet the highest frequency requirement for testing the devices of the highest operating frequency.

Therefore, the cost of the circuit components in the conventional semiconductor equipment of FIG. 2 becomes considerably high and the size of such circuit components tends to increase. Furthermore, the density and performance of recent semiconductor devices are ever increasing. For example, some recent large scale integrated circuits have a large number of pins up to 256 or 512 or more. Accordingly, for testing such devices, the semiconductor test equipment has to install the corresponding sets of circuit components therein. One of the most recent semiconductor test equipment includes 1,000 sets of the circuit components to accommodate a semiconductor device having 1000 pins, which extremely increases the cost of the test equipment.

Therefore, in the conventional semiconductor test equipment of FIG. 2, the cost and size of the circuit components increases with increase of the device capability and the number of device pins.

SUMMARY OF THE INVENTION

Therefore, it is an object of the present invention to provide a semiconductor test equipment which is capable of decreasing the cost and size of the circuit components in the test equipment.

The semiconductor test equipment of the present invention for testing a semiconductor device (device under test) includes a main clock generator circuit which generates a main clock signal having the highest frequency for the semiconductor testing equipment, a first pattern generator which receives the main clock signal from the main clock generator for generating a first test pattern signal having a frequency corresponding to the main clock signal, a clock divider which divides the main clock signal by a predetermined rate to generate a lower frequency clock signal, and a second pattern generator which receives the lower frequency clock signal from the clock divider for generating a second test pattern having a frequency corresponding to the lower frequency clock signal.

In another aspect of the semiconductor test equipment of the present invention further includes a first wave formatter which receives the first pattern signal from the first pattern generator and forms a predetermined wave shape to be provided to the device under test, and a second wave formatter which receives the second pattern signal from the second pattern generator and forms a predetermined wave shape to be provided to the device under test.

In further aspect of the semiconductor test equipment of the present invention further includes a first comparator circuit which receives a first output signal from the device under test and compares the first output signal with a first expected pattern from the first pattern generator wherein the first output signal is resulted from the first pattern signal, and a second comparator circuit which receives a second output signal from the device under test and compares the second output signal with a second expected pattern from the second pattern generator wherein the second output signal is resulted from the second pattern signal.

According to the present invention, the cost performance of the semiconductor test equipment is greatly improved because not all of the pattern generators, the wave formatter circuits, the comparator circuits have to be designed to perform the highest capability to satisfy all of the device pins of the semiconductor device to be tested. The semiconductor test equipment of the present invention includes two or more kinds of circuit components, one of which is designed to perform the highest capability while the others are designed to perform the lower level capabilities. Namely, the present invention is made based on the fact that not all of the pins of a large scale semiconductor device to be tested operate at the highest speed or largest voltage swing of the device. The test for such device can be accomplished by providing the highest capability for some of the pins while it is sufficient to provide the lower level capabilities for other pins of the device under test.

As a result, a significant cost down is easily realized in the semiconductor test equipment because the test equipment has to includes a large scale circuit components to meet a semiconductor device having a large number of pins and a large portions of which can be equipped with a lower level circuit components. Further, each circuit component in the semiconductor test equipment becomes small because many of the circuit components do not require the highest performance. Therefore, the reduction of the circuit size will be achieved which will also realize a reduction of power consumption.

DETAILED DESCRIPTION OF THE INVENTION

The present invention is made based on the fact that not all of the pins of a large scale semiconductor device to be tested operate at the highest speed or largest voltage swing of the device. For example, even though the specification of a device to be tested indicates that the highest operating speed is 100 MHz, only several pins actually operate at the highest speed of 100 MHz and many other pins operate considerably lower operating speed. For testing such a device by the conventional technique having capability of highest possible performance in all of the circuit components corresponding to all of the pins of the device is not economical since the capability of most of the circuit components is useless. Namely, too much capability and too many functions are provided in the conventional test equipment, and as a result, the semiconductor testing equipment becomes high cost and larger scale.

Figure 1A:
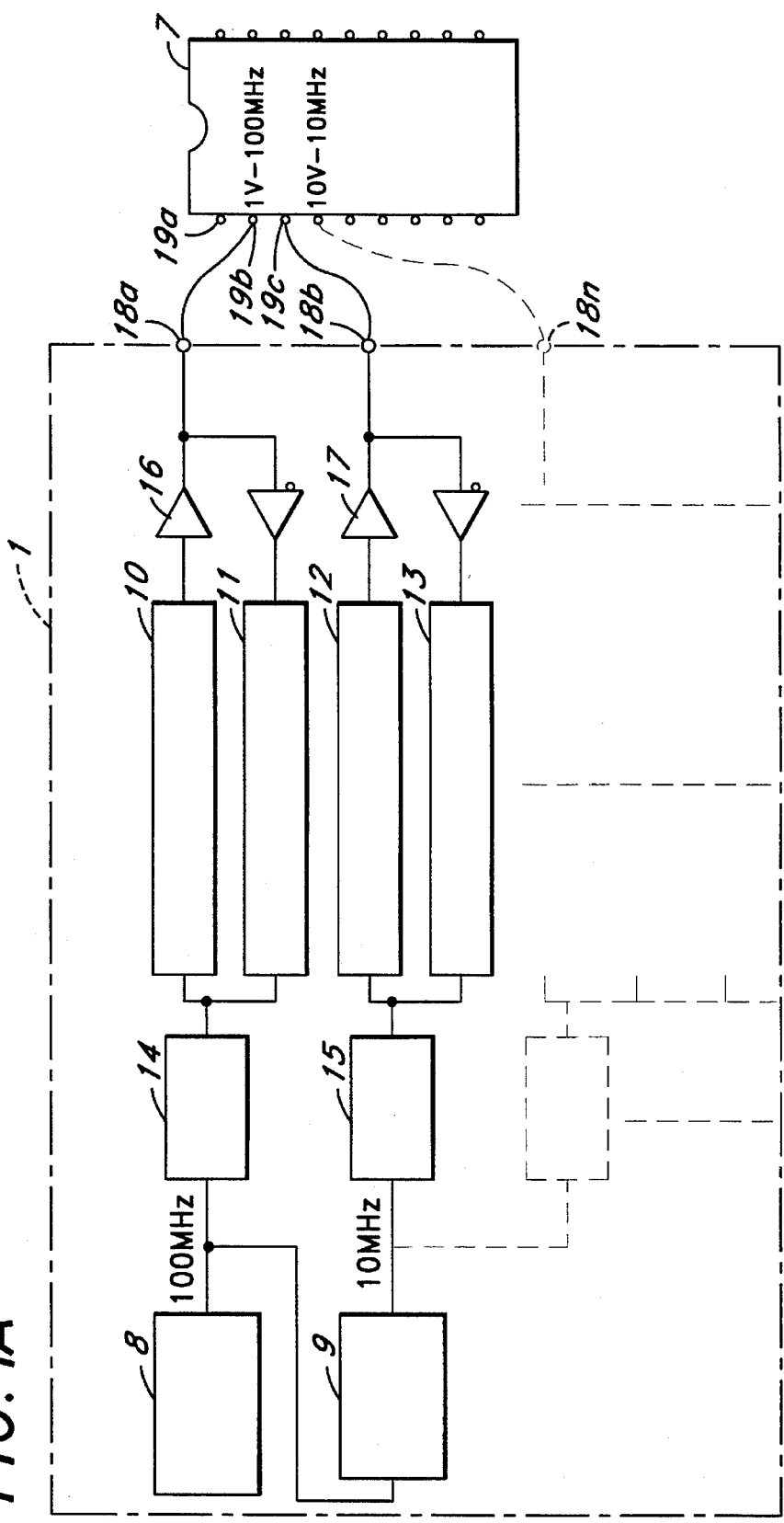
FIG. 1A is a block diagram showing a structure of the semiconductor test equipment of the present invention including A-type circuit components and B-type circuit components.
Figure 1B:
FIG. 1B is a timing chart showing relationship between the main clock and the divided clock.
Figure 2:
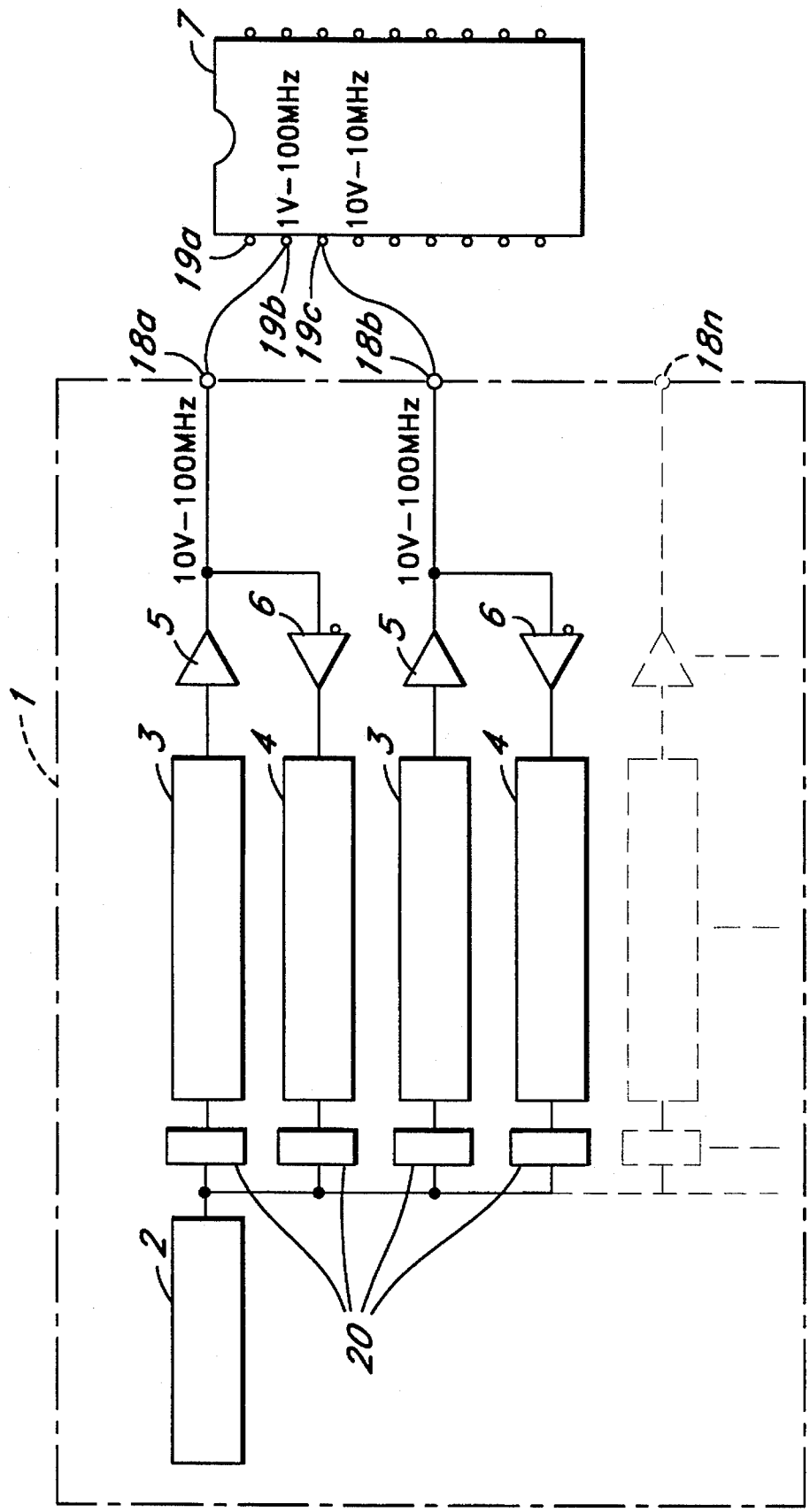
FIG. 2 is a block diagram showing a structure of the conventional semiconductor test equipment.

FIG. 1 is a block diagram showing a structure of the embodiment of the present invention. A semiconductor test equipment 1 of the present invention has two kinds of circuit components, A-type components having the highest capabilities and B-type components having lower capabilities. The A-type circuit components include a pattern generator 14, a wave formatter 10, a driver 16, an analog comparator 6, a logic comparator 11. The A-type circuit components are used for testing a pin 19b through an output pin 18a of the test equipment 1. The B-type circuit components include a pattern generator 15, a wave formatter 12, a driver 17, an analog comparator 6, a logic comparator 13. The B-type circuit components are used for testing a pin 19c through an output pin 18b of the test equipment 1. Since the analog comparator 6 is a small circuit component, A-type analog comparators can be used for all of the analog comparators.

The semiconductor test equipment has a main clock generator circuit 8 which provides a clock signal to the pattern generator 14 and thus determines the operating speed of the pattern generator 14, the wave formatter 10 and the driver 16. The main clock is divided by a n/m divider circuit 9 to generate a lower frequency clock signal to be supplied to the pattern generator 15. Thus, the divided clock signal from the divider 19 determines the operating speed of the pattern generator 15, the wave formatter 12 and the driver 17.

In this example, the semiconductor testing equipment 1 outputs a higher speed test signal which is generated by the wave formatter 10 to the pin 19b of the device 7 to be tested through the driver 16 and the output pin 18a. The test equipment 1 outputs a lower speed test signal which is generated by the wave formatter 10 to the pin 19c of the device under test (DUT) 7 to be tested through the driver 17 and the output pin 18b. In a similar manner, the test equipment provides test signals to other pins of the DUT 7 through the A-type circuit components or the B-type circuit components. The required voltage swings of the test signals for pins 19a, 19b, . . . 19n of the DUT 7 are also determined by the drivers 16 and 17.

For more specific example, the A-type circuit components output a test signal of which the voltage is 1 V and the frequency is 100 MHz from the output pin 18a. The signal is supplied to the device pin 19b of the DUT 7 to be measured. The n/m divider circuit 9 outputs 10 MHz which is 1/10 of 100 MHz of the main clock frequency. The pattern generator 12 which is the B-type circuit receives the 10 MHz clock signal. Thus, the B-type circuit components output a test signal of which the voltage is 10 V and the frequency is 10 MHz from the output pin 18b.

Although the circuit components in the above example are classified into two kinds, the A-type and B-type, it is apparent that the semiconductor test equipment can have three or more kinds of circuit components in terms of level of performance. The inventive features of the present invention resides in that the semiconductor test equipment has two or more pattern generators, wave formatters, drivers, analog comparators, and logic comparators.

For a semiconductor device having a different pin arrangement from the other, the connections between the output pins 18a, 18b, . . . 18n and the device pins 19a, 19b, . . . 19n have to be changed. Such a change in the connections can be accomplished by changing a performance board (not shown) which will be provided between the semiconductor test equipment and the device to be tested as is well known in the art.

In the test equipment of the present invention, for example, 512 pattern generators, 512 wave formatters, 512 comparator circuits and other are not comprised of the same type of circuit components for the same performance. They are comprised of circuit components of different performance level of signals which are applied to different type of the pins 19a, 19b, . . . 19n of the DUT 7.

That is, all of the pattern generators, the wave formatters, the comparator circuits are not designed for the highest specification of the semiconductor testing equipment or the highest performance of a device to be tested. Instead, the circuit components are comprised of two or more kinds of different performance levels so that the test signals of different frequency, voltage and current are supplied to each pin of the device under test and the resulted signal from the device under test of different frequencies and the voltage levels are compared by the comparator circuits.

In the example mentioned above, the wave formatters and the drivers are functionally separated. However, these circuit components can be formed in one functional circuit. Similarly, the analog comparators and the logic comparators can be formed in one logic circuit.

Moreover, above mentioned embodiment of the present invention, the semiconductor test equipment 1 comprises the combination of the different types of the pattern generators, the wave formatters, the analog comparators and the logic comparators. However, the part of the circuit of these plural types can be comprised of the circuit components of the same type if the cost performance is not important. Examples of such arrangements are as follows:

(1) The wave formatters of the same type throughout the semiconductor test equipment.

(2) The comparator circuits of the same type throughout the test equipment.

(3) Both of the wave formatters and the comparator circuits of the same type throughout the test equipment.

The output of the main clock generator circuit 8 is divided by the n/m divider circuit 9 as shown in FIG. 1 (B). The value of n and m can be freely set. Preferably, a ratio n per m in the divided clock frequency can be changed in real time.

According to the present invention in the foregoing, the following effects are expected.

(1) The cost performance of the semiconductor test equipment is improved because all of the pattern generators, the wave formatter circuits, the comparator circuits are not corresponded for the highest performance in the functional specification of the semiconductor test equipment and cutting useless performances in the actual testing. As a result, a big cost down in the semiconductor test equipment is realized easily and effectively because the test equipment has to includes a large scale circuit components to meet a semiconductor device having a large number of pins.

(2) The each circuit in the semiconductor test equipment becomes small because many of the circuit components do not require the highest performance. Therefore, the reduction of the circuit size will be achieved which will also realize a reduction of power consumption.

(3) The signal which each pin of the DUT to be measured demands will be diversified more and more in the future. The construction of the present invention can correspond to those demands extremely flexibly and easily.

What is claimed is:

1. A semiconductor test equipment for testing a semiconductor device, comprising:

a main clock generator circuit which generates a main clock signal having the highest frequency for the semiconductor testing equipment;

a first pattern generator which receives said main clock signal from the said main clock generator for generating a first test pattern signal having a frequency corresponding to said main clock signal;

a clock divider which divides said main clock signal by a predetermined rate to generate a lower frequency clock signal;

a second pattern generator which receives said lower frequency clock signal from said clock divider for generating a second test pattern having a frequency corresponding to said lower frequency clock signal, said second pattern generator being inoperable at a rate of said main clock signal;

a first wave formatter which receives said first pattern signal from said first pattern generator and forms a predetermined wave shape to be provided to said device under test; and a second wave formatter which receives said second pattern signal from said second pattern generator and forms a predetermined wave shape to be provided to said device under test, said second wave formatter being inoperable at said rate of said main clock signal.

2. A semiconductor test equipment as defined in claim 1, further including:

a first driver which receives said first pattern signal formatted by said first wave formatter and determines a first voltage swing of said first pattern signal to be provided to said device under test; and a second driver which receives said second pattern signal formatted by said second wave formatter and determines a second voltage swing of said second pattern signal to be provided to said device under test, said second driver being inoperable at said rate of said main clock signal, and said second voltage swing is significantly smaller than said first voltage swing.

3. A semiconductor test equipment as defined in claim 2, further including:

a first comparator circuit which receives a first output signal from said device under test and compares said first output signal with a first expected pattern from said first pattern generator, said first output signal being resulted from said first pattern signal; and a second comparator circuit which receives a second output signal from said device under test and compares said second output signal with a second expected pattern from said second pattern generator, said second comparator circuit being inoperable at said rate of said main clock signal, said second output signal is resulted from said second pattern signal.

4. A semiconductor test equipment as defined in claim 3, wherein each of said first and second comparator circuits includes an analog comparator for determining a logical level of said output signal from said device under test and a logic comparator for comparing the logical states of an output of said analog comparator with said expected pattern.

* * * * *